(12) United States Patent
Isoda et al.

(10) Patent No.: US 9,771,303 B2
(45) Date of Patent: Sep. 26, 2017

(54) CORDIERITE SINTERED BODY, METHOD FOR MANUFACTURING THE SAME, COMPOSITE SUBSTRATE, AND ELECTRONIC DEVICE

(71) Applicant: NGK INSULATORS, LTD., Nagoya (JP)

(72) Inventors: Yoshinori Isoda, Ichinomiya (JP); Yosuke Sato, Hashima-Gun (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/160,224

(22) Filed: May 20, 2016

(65) Prior Publication Data

US 2016/0264471 A1    Sep. 15, 2016

Related U.S. Application Data

(63) Continuation of application No. PCT/JP2015/065096, filed on May 26, 2015.

(30) Foreign Application Priority Data

Jun. 6, 2014 (JP) ................................ 2014-117926
Mar. 23, 2015 (JP) ................................ 2015-059873

(51) Int. Cl.
   *C04B 35/195*    (2006.01)
   *C04B 37/00*     (2006.01)
   (Continued)

(52) U.S. Cl.
   CPC .......... *C04B 35/195* (2013.01); *C04B 35/645* (2013.01); *C04B 35/6455* (2013.01);
   (Continued)

(58) Field of Classification Search
   CPC ........................ C04B 35/195; C04B 35/6455
   See application file for complete search history.

(56) References Cited

U.S. PATENT DOCUMENTS 5,064,790 A    11/1991   Bedard et al.
5,177,033 A     1/1993   Awano et al.
(Continued)

FOREIGN PATENT DOCUMENTS

EP   2 392 552 A1   12/2011
JP   63-089455 A     4/1988
(Continued)

OTHER PUBLICATIONS

Awano et al, EP0458286A1, Nov. 27, 1991.*
(Continued)

*Primary Examiner* — Aaron Austin
*Assistant Examiner* — Jasper Saberi
(74) *Attorney, Agent, or Firm* — Burr & Brown, PLLC

(57) ABSTRACT

In an X-ray diffraction diagram of a cordierite sintered body of the present invention, the ratio of the total of the maximum peak intensities of components other than cordierite components to the peak top intensity of the (110) plane of cordierite is 0.0025 or less. Since having a significantly small amount of different phases other than the cordierite components, this cordierite sintered body has a high surface flatness when the surface thereof is mirror-polished.

12 Claims, 7 Drawing Sheets

(51) Int. Cl.
*C04B 35/645* (2006.01)
*C30B 33/06* (2006.01)

(52) U.S. Cl.
CPC .............. *C04B 37/00* (2013.01); *C30B 33/06* (2013.01); *C04B 2235/3272* (2013.01); *C04B 2235/3418* (2013.01); *C04B 2235/3481* (2013.01); *C04B 2235/5445* (2013.01); *C04B 2235/6562* (2013.01); *C04B 2235/6565* (2013.01); *C04B 2235/6567* (2013.01); *C04B 2235/662* (2013.01); *C04B 2235/72* (2013.01); *C04B 2235/76* (2013.01); *C04B 2235/77* (2013.01); *C04B 2235/80* (2013.01); *C04B 2235/96* (2013.01); *C04B 2235/963* (2013.01); *C04B 2235/9646* (2013.01); *C04B 2237/30* (2013.01); *C04B 2237/52* (2013.01); *C04B 2237/55* (2013.01)

(56) References Cited

U.S. PATENT DOCUMENTS

| | | | |
|---|---|---|---|
| 5,998,907 | A | 12/1999 | Taguchi et al. |
| 2002/0010073 | A1 | 1/2002 | Beall et al. |
| 2004/0226162 | A1* | 11/2004 | Miura ..................... H03H 3/08 29/594 |
| 2005/0215417 | A1* | 9/2005 | Teratani ................ C04B 35/195 501/119 |
| 2008/0096758 | A1 | 4/2008 | Unno et al. |
| 2012/0100982 | A1 | 4/2012 | Sugawara |

FOREIGN PATENT DOCUMENTS

| | | | |
|---|---|---|---|
| JP | EP 0458286 A1 * | 11/1991 | ............. C01B 33/26 |
| JP | 04-026543 A1 | 1/1992 | |
| JP | 11-055070 A1 | 2/1999 | |
| JP | 2001-110841 A1 | 4/2001 | |
| JP | 2002-321969 A1 | 11/2002 | |
| JP | 2005-314215 A1 | 11/2005 | |
| JP | 3774782 B2 | 5/2006 | |
| JP | 2008-007341 A1 | 1/2008 | |
| JP | 2010-173878 A1 | 8/2010 | |
| JP | 2012-087026 A1 | 5/2012 | |
| KR | 10-2001-0086454 | 9/2001 | |

OTHER PUBLICATIONS

Taiwanese Office Action (Application No. 104117123) dated Jul. 4, 2016.
International Search Report and Written Opinion (Application No. PCT/JP2015/065096) dated Sep. 1, 2015.
Japanese Office Acton (Application No. 2015-550108) dated Dec. 8, 2015 (with English translation).
International Preliminary Report on Patentability (Application No. PCT/JP2015/065096) mailed Dec. 15, 2016.
Chinese Office Action (With English Translation), Chinese Application No. 201580002729.5, dated Feb. 15, 2017 (13 pages).

* cited by examiner

CORDIERITE SINTERED BODY, METHOD FOR MANUFACTURING THE SAME, COMPOSITE SUBSTRATE, AND ELECTRONIC DEVICE

BACKGROUND OF THE INVENTION

1. Field of the Invention

The present invention relates to a cordierite sintered body, a method for manufacturing the same, a composite substrate, and an electronic device.

2. Description of the Related Art

Since being a material having a high heat resistance and a low coefficient of thermal expansion, a cordierite sintered body has been known as a material having a high heat shock resistance. In particular, a porously sintered structural body has been widely used as a filter or a catalyst carrier for cleaning of exhaust gas emitted from automobiles and the like.

In recent years, by the use of characteristics, such as a low coefficient of thermal expansion and light weight, a dense cordierite sintered body has been increasingly employed as a stage member (Patent Literature 1) of an exposure apparatus or the like or an ultra-precise mirror substrate (Patent Literature 2). According to Patent Literature 1, in particular, in order to obtain a high rigidity, improvement has been made in such a way that a CaO content of the cordierite sintered body is set to 0.2 to 0.8 percent by mass, and as a subcrystal, a predetermined amount of $Al_2O_3$ is contained. It has been believed that CaO has an effect of improving Young's modulus of cordierite by promoting grain growth and sintering properties thereof and that $Al_2O_3$ has an effect of densifying cordierite by suppressing abnormal grain growth thereof. According to Patent Literature 2, besides obtaining a high rigidity, in order to decrease the surface roughness, a predetermined amount of a specific rare earth metal component is added as a sintering auxiliary agent, so that a dense cordierite sintered body is formed. In the sintered body thus obtained, crystal phases other than that of cordierite are not contained, and the rare earth metal-containing component is present in the form of a membrane along the grain boundary of cordierite grains as an amorphous phase. It has been believed that since the crystal components other than that of cordierite are not present, the generation of surface irregularities due to the difference in polishing properties between different grains can be avoided.

An example in which a dense cordierite sintered body is formed without adding a sintering auxiliary agent has been disclosed in Patent Literature 3. In this example, a molded body obtained by uniaxial die press molding of a cordierite powder having an average grain diameter of 0.7 μm or less is fired at 1,400° C. for 12 hours in a nitrogen atmosphere, so that a cordierite sintered body is formed which has characteristics, such as a cordierite content of 97.6 percent by mass, a bulk density of 2.54 g/cm³, an open porosity of 0%, and a total porosity of 0.1%, and which has different phases of mullite, spinel, and sapphirine (Example 1). It is found that this sintered body has a closed porosity of 0.1% from the total porosity and the open porosity and that from a photo of a polished surface after thermal etching shown in FIG. 2, approximately 20 closed pores having a major axis of approximately 0.2 to 0.5 μm are present in a surface having an area of approximately 20 μm².

In addition, in recent years, as a surface acoustic wave device, the structure in which a main substrate and an auxiliary substrate are joined to each other has been developed. For example, Patent Literature 4 has disclosed a surface acoustic wave device in which a main substrate formed of lithium tantalate, lithium niobate, or the like and an auxiliary substrate formed of glass or silicon are directly joined to each other. In this surface acoustic wave device, the coefficient of thermal expansion of the auxiliary substrate is lower than that of the main substrate, and the thickness of the auxiliary substrate is larger than that or the main substrate. When the main substrate and the auxiliary substrate as described above are used in combination, in the case in which the temperature of the substrate is increased, a compressive stress works in the vicinity of the surface of the main substrate, and a smaller thermal expansion than the inherent thermal expansion of the main substrate is obtained. As a result, it has been explained that the frequency temperature dependence of the surface acoustic wave device using the main substrate is improved. In addition, it has also been explained that in the case in which the auxiliary substance is formed of glass, since the coefficient of thermal expansion thereof is 4.5 ppm/° C., and the glass has amorphous properties, joining with the main substrate which is a single crystal can be easily performed. However, the surface condition of the main substrate and that of the auxiliary substrate, which are to be joined to each other, have not been described in detail.

Patent Literature 5 has disclosed, as is the case of Patent Literature 4, a technique of improving the temperature dependence of a surface acoustic wave device. A piezoelectric substrate (main substrate) is formed of lithium tantalate or lithium niobate, a support substrate (auxiliary substrate) is formed of sapphire, aluminum oxide, aluminum nitride, or silicon nitride (coefficient of thermal expansion: 2.6 ppm/° C.), and a joined substrate is formed by direct joining. However, the surface condition required for the support substrate and tie like has not been described.

CITATION LIST

Patent Literature

PTL 1: JP 2010-173878 A
PTL 2: JP 2012-87026 A
PTL 3: JP 2005-314215 A
PTL 4: JP 11-55070 A
PTL 5: JP 3774782 B

SUMMARY OF THE INVENTION

According to the cordierite sintered bodies disclosed in Patent Literatures 1 and 2, since a predetermined amount of the sintering auxiliary agent component is contained besides the cordierite components, a phase other than that of the cordierite is present as a crystal phase or an amorphous phase, and a sintered body texture is a mixture of the cordierite phase and the other phase. Since those phases are different from each other in terms of chemical properties and physical properties, the degree of polishability becomes different between the phases when processing, such as surface polishing, is performed. In particular, in the case in with chemical mechanical polishing (CMP) is performed using an acidic or an alkaline slurry, the difference of the degree described above becomes apparent, and surface irregularities are generated thereby. Hence, in the cordierite sintered bodies disclosed in Patent Literatures 1 and 2, the surface flatness is very difficult to be improved. On the other hand, according to the cordierite sintered body disclosed in Patent Literature 3, although no sintering auxiliary agent component is added, different phases of the components, such as mullite and spinel, each of which is not formed into cordierite, are present, and although the degree of densification is increased, many closed pores are present. By the presence of those different phases and closed pores, a sufficient surface flatness cannot be obtained.

In addition, in the surface acoustic wave devices of Patent Literatures 4 and 5, although a polycrystalline material (sintered body) formed of aluminum oxide, aluminum nitride, silicon nitride, or the like is used as the support substrate, the different phases and the pores as described above have not been disclosed at all, and the degree of surface flatness has not been known. In this surface acoustic wave device, as the frequency temperature dependence is decreased, characteristic stability with the change in environmental temperature is increased, and as a result, a high performance element can be obtained. In order to realize a higher performance element than a related element, the coefficient of thermal expansion of the element is required to be further decreased.

The present invention was made in order to resolve the problems as described above and primarily aims to provide a cordierite sintered body having a high surface flatness when being mirror-polished. In addition, the present invention also aims to provide a composite substrate using the cordierite sintered body as described above as a support substrate.

In an X-ray diffraction diagram of a cordierite sintered body of the present invention, the ratio of the total of the maximum peak intensities of components other than cordierite components to the peak for intensity of the (110) plane of cordierite is 0.0025 or less. Since having a significantly small amount of different phases other than the cordierite components this cordierite sintered body has a high surface flatness when the surface thereof is mirror-polished.

A method for manufacturing a cordierite sintered body of the present invention is a method for manufacturing a cordierite sintered body by sintering a cordierite raw material powder containing an MgO component, an $Al_2O_3$ component, and a $SiO_2$ component in an inert gas atmosphere using a hot press method. In the cordierite raw material powder, the molar ratio of $MgO/Al_2O_3$ is 0.96 to 1.04, the molar ratio of $SiO_2/Al_2O_3$ is 2.46 to 2.54, the rate of the three components, that is, MgO, $SiO_2$, and $Al_2O_3$, to the total is 99.9 percent by mass or more, and the average grain diameter D50 is 1 μm or less. As the conditions for sintering using the hot press method, the press pressure is 20 to 300 kgf/cm², and the firing temperature is 1,410° C. to 1,450° C. This manufacturing method is suitable for manufacturing the cordierite sintered body of the present invention described above.

A composite substrate of the present invention is a substrate formed by joining a functional substrate and a support substrate formed of a cordierite sintered body, and the rate (joining area rate) of an area at which the substrates are actually joined to each other to a joining interface is 80% or more. In this composite substrate, when the cordierite sintered body is the cordierite sintered body of the present invention described above, the joining area rate is increased as described above, and preferable joining properties are obtained.

An electronic device of the present invention is a device using the composite substrate described above. In this electronic device, since the coefficient of thermal expansion of the cordierite sintered body used as the support substrate is very small, such as approximately 1.1 ppm/K (40° C. to 400° C.), in the case of a surface acoustic wave device, the frequency temperature dependence is significantly improved. In addition, in an optical waveguide device, an LED device, and a switching device, since the coefficient of thermal expansion of the support substrate is significantly small, the performance thereof is also improved.

DETAILED DESCRIPTION OF THE INVENTION

Figure 1:
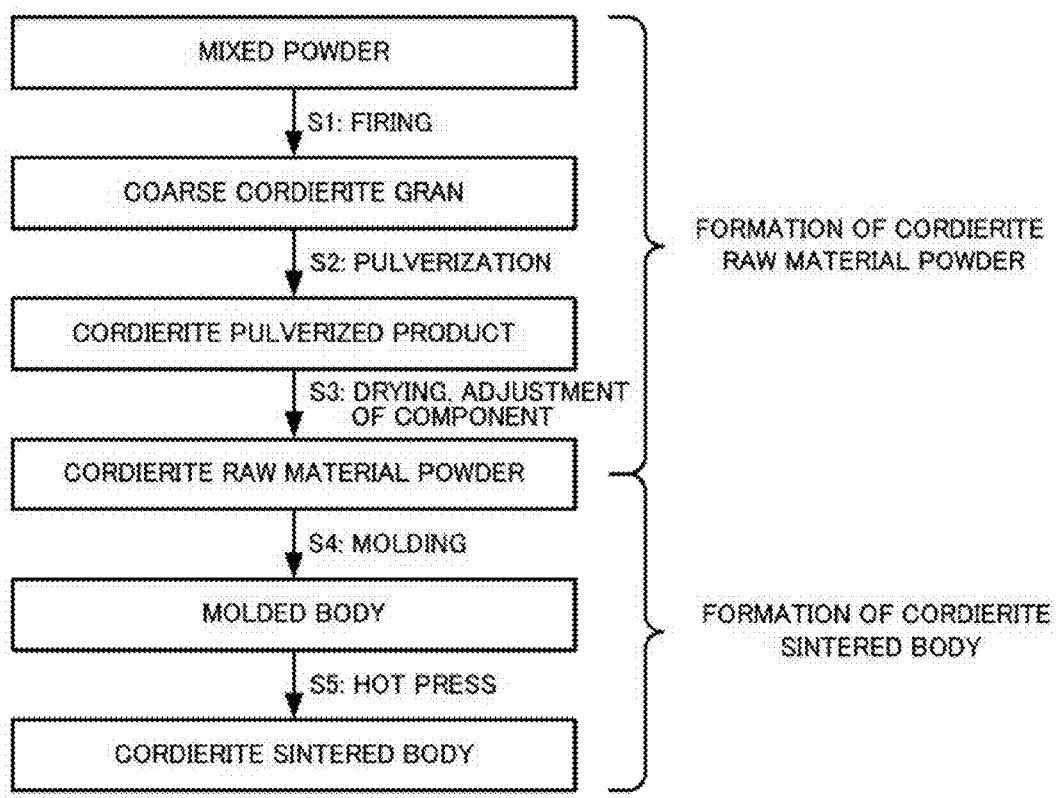
FIG. 1 is a manufacturing flow of a cordierite sintered body.

Hereinafter, although embodiments of the present invention will be described in detail, the present invention is not limited to the following embodiments, and it is to be naturally understood that the present invention may be, for example, appropriately changed and improved based on common knowledge of a person skilled in the art without departing from the scope of the present invention.

In an X-ray diffraction diagram of a cordierite sintered body of the present invention, the ratio of the total of the maximum peak intensities of components other than cordierite components to the peak top intensity of the (110) plane of cordierite is 0.0025 or less. In addition, the measurement of the X-ray diffraction diagram is performed at 50 kV, 300 mA, and 2θ=5° to 70° using the CuKα line. In this cordierite sintered body, since the amount of different phases other than the cordierite components is significantly small, when the surface of the cordierite sintered body is mirror-polished, the surface flatness thereof is high. As for the surface flatness, for example when a mirror-polished surface is observed using an AFM, at least one of the case in which a center line average roughness Ra in a 10-μm square measurement region is 1 nm or less, the case in which a maximum peak height Rp in a 70-μm square measurement region is 30 nm or less, and the case in which the number of pores having a maximum length of 0.1 μm or more in an arbitrary region of 4 μm×4 μm is 10 or less is preferably satisfied. Incidentally, when the amount of a different phase component is large, since the degree of polishability becomes different between cordierite and the different phase component, and in particular, since the different phase component is difficult to be polished and is liable to remain in a convex shape, the surface flatness cannot be sufficiently increased.

In the cordierite sintered body of the present invention, the molar ratio of $MgO/Al_2O_3$ and that of $SiO_2/Al_2O_3$ are preferably 0.96 to 1.04 and 2.46 to 2.54, respectively. In addition, the rate of the three components, that is, MgO, $Al_2O_3$, and $SiO_2$, to the total is preferably 99.9 percent by mass or more, and in other words, the rate of the components other than those three components is preferably less than 0.1 percent by mass. Furthermore, the average grain diameter of the cordierite sintered grains is preferably 1 μm or less. Furthermore, the bulk density is also preferably 2.495 to 2.515 g/cm$^3$ (true density: 2.505 g/cm$^3$). By the cordierite sintered body as described above, the amount of the different phase components therein can be further decreased.

In the cordierite sintered body of the present invention, the total light transmittance and the linear transmittance with respect to light having a wavelength of 550 nm are preferably 60% or more and 50% or more, respectively, and more preferably 70% or more and 60% or more, respectively. Accordingly, since having a high translucency and also having a high transparency due to a high linear transmittance, when the cordierite sintered body described above is used to form a composite substrate, the function as a light transmissive support substrate can be obtained. Furthermore, since having a high heat stability and a high heat shock resistance, the cordierite sintered body of the present invention can be used as a material for a heat resistant translucent apparatus, such as a window material of a high temperature furnace or a reaction tube of a light condensing furnace. As the material described above, heretofore, a quartz glass or a translucent alumina has been used. However, a quartz glass is required to be used at 1,000° C. or less. In addition, although a translucent alumina is usable at 1,000° C. or more, a care must be taken against heat shock. On the other hand, since having a high heat resistance as compared to that of a quartz glass, the cordierite sintered body of the present invention can be used at 1,000° C. or more, and since having a high heat shock resistance as compared to that of a translucent alumina, the cordierite sintered body of the present invention can be used as a material of a heat resistant translucent apparatus without taking a care against heat shock. In addition, when the cordierite sintered body of the present invention is processed by an annealing treatment at 1,200° C. to 1,400° C., the translucency and the transparency thereof can be further improved.

Next, an embodiment of a method for manufacturing a cordierite sintered body according to the present invention will be described. A manufacturing flow of a cordierite sintered body includes, as shown in FIG. 1, a step of forming a cordierite raw material powder and a step of forming a cordierite sintered body.

(Formation of Cordierite Raw Material Powder)

A mixed powder containing an MgO component, an Al$_2$O$_3$ component, and a SiO$_2$ component, each of which is blended at a predetermined rate, is fired to form coarse cordierite grains (S1 of FIG. 1). In this case, the mixed powder represents a powder of mixed three components which will form cordierite by firing and is preferably a mixed powder in which for example, an MgO component, an Al$_2$O$_3$ component, and a SiO$_2$ component are blended to have 13.8, 34.9, and 51.3 percent by mass, respectively. Alternatively, when the amount of a component to be mixed in during a pulverization step can be estimated in advance, for example, when the amount of an alumina component mixed in from alumina media (such as alumina balls and an alumina pot) used in a pulverization step can be estimated, the amount of the Al$_2$O$_3$ component to be blended as part of the mixed powder may be decreased. Furthermore, in the cordierite sintered body of the present invention, it is important to avoid the case in which an impurity component forms a different phase; hence, a raw material having a higher purity as much as possible is preferably used, and the components to be blended as the parts of the mixed powder each preferably have a purity of 99.9% or more. However, components, such as CO$_2$ and H$_2$O, which are to be scattered away by heating, are not included in the impurities.

Next, the coarse cordierite grains obtained by firing the mixed powder are pulverized to form a cordierite pulverized product (S2 of FIG. 1). The firing of the mixed powder may be performed by heating to 1,300° C. to 1,450° C. in an air atmosphere. When the coarse cordierite grains are pulverized, pulverization is performed so that the average grain diameter (D50) of the cordierite pulverized product is 2 μm or less, preferably 1 μm or less, and further preferably 0.8 μm or less. As described above, when the average grain diameter of the cordierite pulverized product is decreased, without adding a sintering auxiliary agent component, a highly dense cordierite sintered body can be formed. Although the lower limit of the average grain diameter of the cordierite pulverized product is not particularly limited, as the average grain diameter is decreased, a pulverization time is increased, and the amount of components to be mixed in from pulverization media (such as balls and a pot) during the pulverization step is increased; hence, the average grain diameter is preferably 0.1 μm or more and further preferably 0.3 μm or more. In addition, this average grain diameter may be measured by a laser diffraction method.

A pulverization method is not particularly limited, and for example, a ball mill, an attritor, a bead mill, or a jet mill may be used. However, in this case, sufficient attention has to be paid to a component to be mixed in from the pulverization media and the amount thereof. That is, cobbles and pots made of alumina, which is not an impurity even if being mixed in, are preferably used. In addition, cobbles and pots made of resins may also be used since they can be removed in a firing step or the like; however, when resin-made cobbles are used, the pulverization will take a long time. On the other hand, when zirconia-made media are used, the pulverization time is required to be shorter so that in particular, a large amount of zirconia is not mixed in. Metal-made media are not preferable since the amount of impurities is increased.

After the cordierite pulverized product as described above is dried, the MgO component amount, the Al$_2$O$_3$ component amount, and the SiO$_2$ component amount in the cordierite pulverized product thus dried were analyzed, and a required amount of a required component is added so that the rate of each component satisfies the cordierite composition; hence, the cordierite raw material powder is prepared (S3 of FIG. 1). For example, when the coarse cordierite grains are pulverized by alumina media, the Al$_2$O$_3$ component amount is excessive with respect to the cordierite composition. Hence, readjustment is performed by addition of predetermined amounts of an MgO powder and a SiO$_2$ powder to the dried cordierite pulverized product to obtain the cordierite composition, and the powder thus readjusted is used as the cordierite raw material powder. In addition, although a mixing treatment similar to the pulverization treatment is also performed on the powder thus readjusted, in this case, it is important that in order to suppress the contamination from the media, the mixing is performed within a short time. Alternatively, by adjusting the amounts of the components of the mixed powder in advance so that the amounts the components contained in the dried cordierite pulverized product satisfy the cordierite composition, the dried cordierite pulverized product may be used as the cordierite raw material powder without any treatments. For example, when the coarse cordierite grains are pulverized using alumina media, in consideration of the amount of an Al$_2$O$_3$ component to be mixed in from the pulverization media, the amount of the $Al_2O_3$ component of the mixed powder may be decreased in advance. Accordingly, the dried cordierite pulverized product may be used as the cordierite raw material powder without any treatments. As described above, a high purity cordierite raw material powder in which the composition and the powder grain diameter are adjusted is prepared. In the cordierite raw material powder thus obtained, for example, the molar ratio of $MgO/Al_2O_3$ is 0.96 to 1.04, the molar ratio of $SiO_2/Al_2O_3$ is 2.46 to 2.54, the rate of the three components, MgO, $SiO_2$, and $Al_2O_3$, to the total is 99.9 percent by mass or more, and the average grain diameter D50 is 1 µm or less.

(Formation of Cordierite Sintered Body)

The cordierite raw material powder thus obtained is molded into a predetermined shape (S4 of FIG. 1). A molding method is not particularly limited, and a general molding method may be used. For example, the cordierite raw material powder as described above may be directly press-molded using a die. In the case of press molding, when the cordierite raw material powder is formed into granules by spray drying, the moldability is improved. In addition, extrusion molding may be performed after a clay-like mixture is formed by addition of an organic binder, or sheet molding may also be performed after a slurry is formed. In those processes described above, the organic binder component is required to be removed before or during the firing step. In addition, high pressure molding may also be performed by CIP (cold isostatic press).

Next, the molded body thus obtained is formed into a cordierite sintered body by heating (S5 of FIG. 1). In this case, in order to improve the surface flatness of the cordierite sintered body, it is important to maintain the size of the sintered grains to be small and to remove pores during sintering. As a method therefore, a hot press method is significantly effective. By the use of this hot press method, compared to normal pressure sintering, densification is performed at a low temperature while fine sintered grains are maintained, and coarse pores frequently observed in normal pressure sintering can be suppressed from remaining. A firing temperature in this hot press is preferably 1,410° C. to 1,450° C. and, in order to decrease the amount of different phases as small as possible, is further preferably 1,420° C. to 1,440° C. In addition, a press pressure in hot press is preferably set to 20 to 300 kgf/cm². In particular, a low press pressure is further preferable since the size of a hot press jig can be reduced, and the life thereof can be increased. A proper holding time at the firing temperature (maximum temperature) can be appropriately selected in consideration of the shape and the size of the molded body, the characteristics of a heating furnace, and the like. A concrete preferable holding time is, for example, 1 to 12 hours, and further preferably 2 to 8 hours. A firing atmosphere is also not particularly limited, and the atmosphere in hot press is generally an inert gas atmosphere of nitrogen, argon, or the like.

Figure 2:
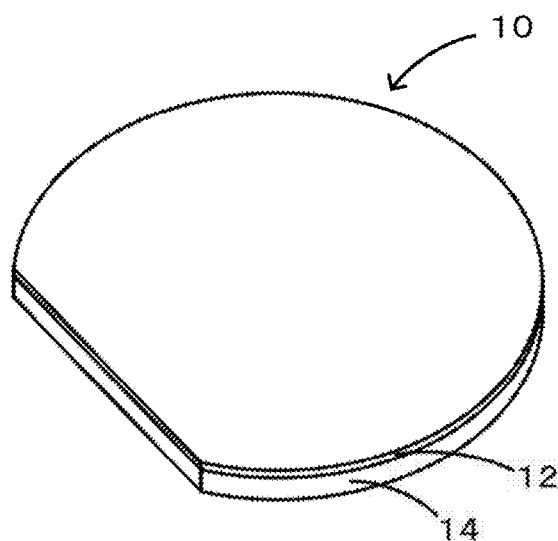
FIG. 2 is a perspective view of a composite substrate 10.

A composite substrate of the present invention is a substrate obtained by joining a functional substrate and a support substrate formed of a cordierite sintered body, and the rate (joining area rate) of an area at which the substrates are actually joined to each other to a joining interface is 80% or more. When the cordierite sintered body of this composite substrate is the cordierite sintered body of the present invention, the joining area rate is increased as described above, and preferable joining properties are obtained. Although the functional substrate is not particularly limited, for example, lithium tantalate, lithium niobate, gallium nitride, and silicon may be mentioned. As the joining method, although either direct joining or indirect joining with an adhesive layer may be used, the direct joining is preferable. In the case of the direct joining, after a joining surface of the functional substrate and that of the support substrate are each activated, the two substrates are pressed while the joining surfaces thereof are set to face each other. For the activation of the joining surface, for example, besides irradiation of ion beams of an inert gas (such as argon) on the joining surface, irradiation of plasma or neutral atom beams thereon may also be performed. On the other hand, when the joining is performed using an adhesive layer provided between the substrates, as the adhesive layer, for example, an epoxy resin or an acrylic resin is used. The ratio (the thickness of the functional substrate/the thickness of the support substrate) of the thickness of the functional substrate to that of the support substrate is preferably 0.1 or less. In FIG. 2, one example of the composite substrate is shown. A composite substrate 10 is as substrate obtained by direct joining between a piezoelectric substrate 12 functioning as the functional substrate and a support substrate 14.

Figure 3:
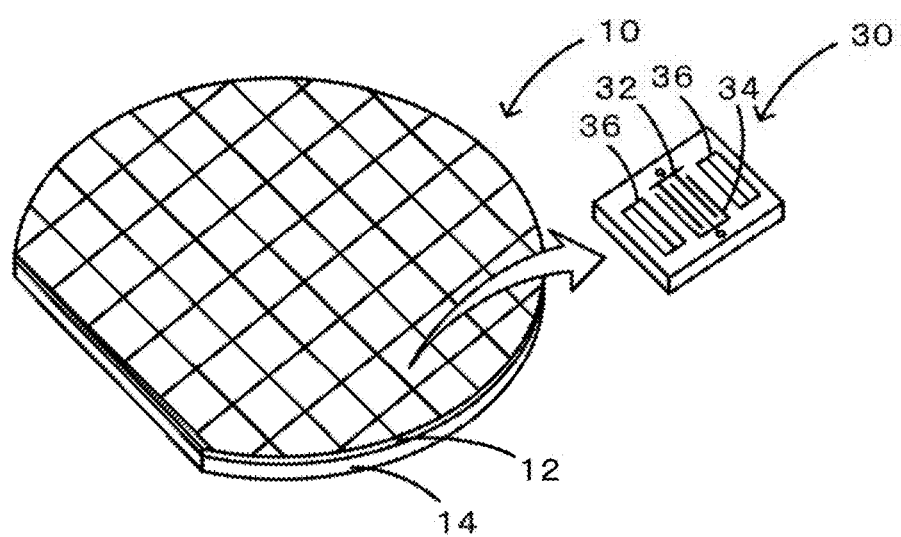
FIG. 3 is a perspective view of an electronic device 30 formed using the composite substrate 10.

An electronic device of the present invention is a device using the composite substrate described above. As the electronic device described above, besides elastic wave devices (such as a surface acoustic wave device, a Lamb wave element, and a film bulk acoustic resonator (FBAR)), for example, an LED device, an optical waveguide device, and a switching device may be mentioned. When the composite substrate described above is used for an elastic wave device, since the coefficient of thermal expansion of the cordierite sintered body functioning as the support substrate is very small, such as approximately 1.1 ppm/K (40° C. to 400° C.), the frequency temperature dependence is significantly improved. One example of an electronic device 30 formed using the composite substrate 10 is shown in FIG. 3. The electronic device 30 is a one-port SAW resonator, that is, is a surface acoustic wave device. First, many patterns each for the electronic device 30 are formed in the piezoelectric substrate 12 of the composite substrate 10 by a general photolithographic technique, and subsequently, the electronic devices 30 are separated from each other by dicing. The electronic device 30 is formed by a photolithographic technique to have IDT (interdigital transducer) electrodes 32 and 34 and reflection electrodes 36 on the surface of the piezoelectric substrate 12.

In addition, a mullite sintered body is also promising. Since being higher in strength and Young's modulus than those of a cordierite sintered body and silicon, the mullite sintered body is advantageously unlikely to be warped and broken. In addition, since having a coefficient of thermal expansion similar to that of silicon or GaN, the mullite sintered body may also be applied to an existing process for silicon or GaN, and since having insulating properties, the mullite sintered body can also be used as a support substrate of an existing device using high resistance silicon. The mullite sintered body may have a mirror-like polished surface, and the surface thereof preferably satisfies the case in which the center line average roughness Ra in a 10-µm square measurement region is 1 nm or less, the case in which the maximum peak height Rp in a 70-µm square measurement region is 30 nm or less, or the case in which the number of pores having a maximum length of 0.1 µm or more in an arbitrary region of 4 µm×4 µm is 10 or less. Furthermore, the mullite sintered body is preferably sintered by hot press. Furthermore, the mullite sintered body may also contain at least one of cordierite, alumina, silica, spinel, and sapphirine as a subphase. A composite substrate may be formed using a support substrate formed of the mullite sintered body as described above and a functional substrate, and in this case, the ratio (the thickness of the functional substrate/the thickness of the support substrate) in thickness between the two substrates is preferably 0.1 or less. In addition, the composite substrate as described above may be used for the electronic device described above.

EXAMPLES

Hereinafter, although the present invention will be described in detail with reference to examples, the present invention is not limited to the following examples.

1. Formation of Cordierite Raw Material Powder
(Raw Material Powders A to I)

For the formation of cordierite raw material powders A to H, commercially available high purity magnesia, alumina, and silica powders, each of which had an average grain diameter of 1 μm or less and a purity of 99.9% or more, were used. In addition, as a comparison, for a raw material powder I, kaolin and talk, which were natural raw materials, were used as parts of alumina, magnesia, and silica sources.

Cordierite Raw Material Powder A

The magnesia, alumina, and silica powders were each weighed to form a cordierite composition and were then fired at 1,400° C. for 5 hours in an air atmosphere, so that coarse cordierite grains were obtained. The coarse cordierite grains thus obtained were pulverized with cobbles (diameter: 3 mm) made of alumina by a pot mill for 70 hours using ion exchanged water as a solvent, so that a cordierite pulverized product having an average grain diameter of approximately 0.5 to 0.6 μm was obtained. After the composition of this pulverized product was analyzed by the method described below, for readjustment, the magnesia powder and the silica powder were appropriately added in amounts each corresponding to the amount of alumina mixed in during a pulverization step so as to obtain the cordierite composition, and mixing was again performed for 4 hours. A slurry obtained thereby was dried at 110° C. under a nitrogen gas flow condition, and the dried product thus obtained was sieved, so that the cordierite raw material powder A was obtained.

Cordierite Raw Material Powders B and C

Except that the magnesia, alumina, and silica powders were weighed to form a composition in which the amount of alumina to be mixed in from alumina media during the pulverization step is decreased from the cordierite composition, and the addition of the magnesia and silica powders was not performed after the pulverization, the cordierite raw material powders B and C were each formed in a manner similar to that of the cordierite raw material powder A.

Cordierite Raw Material Powder D

Except that the addition of the magnesia and the silica was not performed after the pulverization, the cordierite raw material powder D was formed in a manner similar to that of the cordierite raw material powder A.

Cordierite Raw Material Powders E to H

Except that the adjustment of the magnesia and the silica was performed too much or too little after the pulverization, the cordierite raw material powders E to H were each formed in a manner similar to that of the cordierite raw material powder A.

Cordierite Raw Material Powder I

Except that kaolin and talc, which were natural raw materials, were used as parts of alumina, magnesia, and silica sources, the cordierite raw material powder I was formed in a manner similar to that of the cordierite raw material powder A.

In Table 1, the final composition, the amount of impurities, and the average grain diameter of each of the cordierite raw material powders A to I formed as described above are shown.

TABLE 1

| Cordierite Raw Material Powder | Composition | | | | | | Average Grain Diameter D50(μm) |
|---|---|---|---|---|---|---|---|
| | MgO (% by mass) | $Al_2O_3$ (% by mass) | $SiO_2$ (% by mass) | Impurities (% by mass) | $MgO/Al_2O_3$ (molar ratio) | $SiO_2/Al_2O_3$ (molar ratio) | |
| A | 13.81 | 34.81 | 51.30 | <0.1 | 1.00 | 2.50 | 0.58 |
| B | 14.02 | 34.50 | 51.43 | <0.1 | 1.03 | 2.53 | 0.53 |
| C | 13.91 | 34.66 | 51.36 | <0.1 | 1.02 | 2.51 | 0.59 |
| D | 13.47 | 36.19 | 50.27 | <0.1 | 0.94 | 2.36 | 0.55 |
| E | 13.07 | 35.49 | 51.37 | <0.1 | 0.93 | 2.46 | 0.54 |
| F | 13.78 | 35.47 | 50.66 | <0.1 | 0.98 | 2.42 | 0.58 |
| G | 14.80 | 34.08 | 51.03 | <0.1 | 1.10 | 2.54 | 0.56 |
| H | 13.66 | 33.74 | 52.59 | <0.1 | 1.02 | 2.65 | 0.51 |
| I | 13.20 | 34.66 | 50.45 | $Fe_2O_3$: 0.86 $TiO_2$: 0.72 | 0.96 | 2.47 | 0.59 |

2. Formation and Evaluation of Cordierite Sintered Body

The cordierite raw material powders A to I formed as described above were each molded by uniaxial die press molding at 50 kgf/cm$^2$, so that a molded body having a diameter of 100 mm and a thickness of approximately 25 mm was obtained. The molded body thus obtained was placed in a graphite-made mold and was fired using a hot press furnace at a press pressure of 20 to 200 kgf/cm$^2$ and a maximum temperature of 1,400° C. to 1,425° C. for 5 hours, so that a cordierite sintered body was formed. As the firing atmosphere, an argon atmosphere was employed, the temperature increase rate was set to 200° C./hr, and the temperature decrease rate was set to 200° C./hr. During the temperature decrease, the molded body was cooled in the furnace at a temperature of 1,200° C. or less. From each of the cordierite sintered bodies thus obtained, for example, samples, such as flexural strength bars and discs having a diameter of 100 mm and a thickness of 1 mm, were obtained by cutting and were subjected to evaluation tests. The evaluation tests are as shown below.

Composition Analysis

By a high frequency inductively coupled plasma emission spectroscopic analytical method, the amounts of MgO, $Al_2O_3$, $SiO_2$, and impurity components of the cordierite raw material powder and the pulverized product of the cordierite sintered body were measured.

Bulk Density of Sintered Body

By the use of the flexural strength bar, the bulk density was measured by an Archimedes method using purified water.

Crystal Phase

After the cordierite sintered body was pulverized, by the use of an X-ray diffraction apparatus, the identification of each of the cordierite and the different phases and the calculation of the peak top intensity of each phase were performed. The measurement was performed at 50 kV, 300 mA, and 2θ=5° to 70° using the CuKα line, and a rotating anticathode X-ray diffraction apparatus "RINT" manufactured by Rigaku Corp. was used. From the X-ray diffraction diagram, the ratio (Ix) of the total of the maximum peak intensities (Ip, Iq, Ir, . . . ) of different phases (P, Q, R, . . . ) to the peak top intensity (Ic) of the (110) plane of the cordierite was obtained. In addition, when the first peaks (most intense peaks) were overlapped, the second peaks were employed.

$$Ix=(Ip+Iq+Ir...)/Ic$$

Surface Flatness

One surface of a test piece of the cordierite sintered body having a size of 4×3×10 mm was finished to have a mirror-polished surface. The center line average roughness Ra and the maximum peak height Rp of the mirror-finished surface were measured using an AFM. The measurement regions thereof were each set to 10 μm×10 μm and 70 μm×70 μm, respectively. In addition, the polishing was sequentially performed using diamond abrasive grains having a size of 3 μm and diamond abrasive grains having a size of 0.5 μm in this order, and as final finishing, buff polishing was performed using a colloidal silica slurry (pH=11, grain diameter: 80 nm) and a non-woven pad.

Average Grain Diameter of Sintered Grains

The polished surface of the sintered body finished as described above was thermal-etched at 1400° C. for 2 hours, and the size of cordierite sintered grains was calculated as the average grain diameter using a SEM. A linear segment method was used for the calculation, and the value obtained by multiplying the measured value by 1.5 times was regarded as the average grain diameter.

Number of Pores

An arbitrary range of 4 μm×4 μm of the polished surface of the sintered body finished as described above was observed using an AFM, and the number of pores having a maximum length of 0.1 μm or more was measured.

Optical Characteristics

The total light transmittance and the linear transmittance of a test piece of the cordierite sintered body having a thickness of 0.5 mm with respect to light having a wavelength of 200 to 3000 nm were measured. A spectrophotometer was used for the measurement, and light transmitted through the sample was measured using approximately parallel light beams incident on the surface of the sample in the normal direction thereof. As the reference sample, an air layer in the case in which no sample was inserted into a light path was used, and the spectroscopic transmittance thereof was regarded as 1, so that the total light transmittance was calculated by receiving the transmitted light through the sample using an integrating sphere, and the linear transmittance was calculated from the transmitted light in the direction normal to the surface of the sample. The total light transmittance and the linear transmittance each with respect to light having a wavelength of 550 nm were regarded as the typical values.

The details of the formation and the evaluation of the cordierite sintered body will be described with reference to the following Experimental Examples 1 to 17. In Table 2, the formation condition of the sintered body and the composition of the cordierite sintered body of each experimental example are shown, and in Table 3, the results of the evaluation test of each experimental example, that is, the characteristics of the cordierite sintered body thereof, are shown. In addition, Experimental Examples 1 to 3 and 12 to 17 correspond to the examples of the present inventions, and Experimental Examples 4 to 11 correspond to the comparative examples of the present invention. The present invention is not limited to those experiment examples.

TABLE 2

| | Formation Condition of Sintered Body | | | Composition of Sintered Body | | | | | |
|---|---|---|---|---|---|---|---|---|---|
| | Raw Material Powder | Firing Condition | Press Pressure | MgO (% by mass) | $Al_2O_3$ (% by mass) | $SiO_2$ (% by mass) | Impurities (% by mass) | $MgO/Al_2O_3$ (molar ratio) | $SiO_2/Al_2O_3$ (molar ratio) |
| Experimental Example 1 | A | 1425° C. × 5 h | 200 kgf/cm² | 13.79 | 34.83 | 51.31 | <0.1 | 1.00 | 2.50 |
| Experimental Example 2 | B | 1425° C. × 5 h | 200 kgf/cm² | 14.01 | 34.58 | 51.33 | <0.1 | 1.02 | 2.52 |
| Experimental Example 3 | C | 1425° C. × 5 h | 200 kgf/cm² | 13.89 | 34.67 | 51.38 | <0.1 | 1.01 | 2.51 |
| Experimental Example 4 | A | 1400° C. × 5 h | 200 kgf/cm² | 14.09 | 34.40 | 51.45 | <0.1 | 1.04 | 2.54 |
| Experimental Example 5 | B | 1400° C. × 5 h | 200 kgf/cm² | 13.99 | 34.53 | 51.4 | <0.1 | 1.02 | 2.53 |
| Experimental Example 6 | D | 1425° C. × 5 h | 200 kgf/cm² | 13.45 | 36.2 | 50.28 | <0.1 | 0.94 | 2.36 |
| Experimental Example 7 | E | 1425° C. × 5 h | 200 kgf/cm² | 13.02 | 35.38 | 51.52 | <0.1 | 0.93 | 2.47 |
| Experimental Example 8 | F | 1425° C. × 5 h | 200 kgf/cm² | 13.74 | 35.49 | 50.70 | <0.1 | 0.98 | 2.42 |
| Experimental Example 9 | G | 1425° C. × 5 h | 200 kgf/cm² | 14.71 | 34.12 | 51.10 | <0.1 | 1.09 | 2.54 |
| Experimental Example 10 | H | 1425° C. × 5 h | 200 kgf/cm² | 13.70 | 33.67 | 52.55 | <0.1 | 1.03 | 2.65 |

TABLE 2-continued

|  | Formation Condition of Sintered Body | | Composition of Sintered Body | | | | | |
|---|---|---|---|---|---|---|---|---|
|  | Raw Material Powder | Firing Condition | Press Pressure | MgO (% by mass) | $Al_2O_3$ (% by mass) | $SiO_2$ (% by mass) | Impurities (% by mass) | $MgO/Al_2O_3$ (molar ratio) | $SiO_2/Al_2O_3$ (molar ratio) |
| Experimental Example 11 | I | 1400° C. × 5 h | 200 kgf/cm² | 13.15 | 34.65 | 50.40 | $Fe_2O_3$: 0.87 $TiO_2$: 0.72 | 0.96 | 2.47 |
| Experimental Example 12 | A | 1425° C. × 5 h | 20 kgf/cm² | 13.78 | 34.84 | 51.32 | <0.1 | 1.00 | 2.50 |
| Experimental Example 13 | A | 1425° C. × 5 h | 50 kgf/cm² | 13.80 | 34.83 | 51.31 | <0.1 | 1.00 | 2.50 |
| Experimental Example 14 | A | 1425° C. × 5 h | 100 kgf/cm² | 13.79 | 34.83 | 51.31 | <0.1 | 1.00 | 2.50 |

TABLE 3

| | Characteristics of Sintered Body | | | | | | | |
|---|---|---|---|---|---|---|---|---|
| | Bulk Density (g/cm³) | Phase other than Cordierite | Peak Intensity Ratio Ix | Cordierite Average Grain Diameter (μm) | Number of Pores (Number) | Total Light Transmittance (%) | Linear Transmittance (%) | Center Line Average Roughness Ra(nm) | Maximum Peak Height Rp(nm) |
| Experimental Example 1 | 2.507 | corundum | 0.0020 | 0.6 | 3 | 76 | 68 | 0.8 | 20 |
| Experimental Example 2 | 2.497 | corundum | 0.0009 | 0.5 | 8 | 75 | 66 | 0.6 | 18 |
| Experimental Example 3 | 2.501 | corundum | 0.0011 | 0.6 | 5 | 75 | 66 | 0.7 | 16 |
| Experimental Example 4 | 2.506 | corundum cristobalite | 0.0026 | 0.6 | 6 | 71 | 61 | 1.8 | 28 |
| Experimental Example 5 | 2.496 | corundum cristobalite | 0.0030 | 0.6 | 9 | 70 | 60 | 1.3 | 31 |
| Experimental Example 6 | 2.518 | corundum | 0.0058 | 0.6 | 8 | 36 | 30 | 3.5 | 88 |
| Experimental Example 7 | 2.500 | corundum cristobalite | 0.0183 | 0.5 | 4 | <30 | <20 | 3.3 | 67 |
| Experimental Example 8 | 2.511 | corundum | 0.0029 | 0.6 | 3 | 51 | 45 | 2.1 | 40 |
| Experimental Example 9 | 2.520 | corundum cristobalite enstatite | 0.0157 | 0.5 | 2 | <30 | <20 | 1.5 | 29 |
| Experimental Example 10 | 2.493 | corundum cristobalite | 0.0206 | 0.7 | 8 | <30 | <20 | 3.1 | 47 |
| Experimental Example 11 | 2.526 | corundum sapphirine iron oxide | 0.0032 | 0.6 | 5 | =0(gray) | =0(gray) | 3.5 | 84 |
| Experimental Example 12 | 2.507 | corundum | 0.0020 | 0.6 | 3 | 75 | 67 | 0.8 | 21 |
| Experimental Example 13 | 2.507 | corundum | 0.0018 | 0.6 | 3 | 75 | 68 | 0.7 | 18 |
| Experimental Example 14 | 2.507 | corundum | 0.0017 | 0.6 | 3 | 77 | 68 | 0.8 | 18 |

Experimental Example 1

Figure 4:
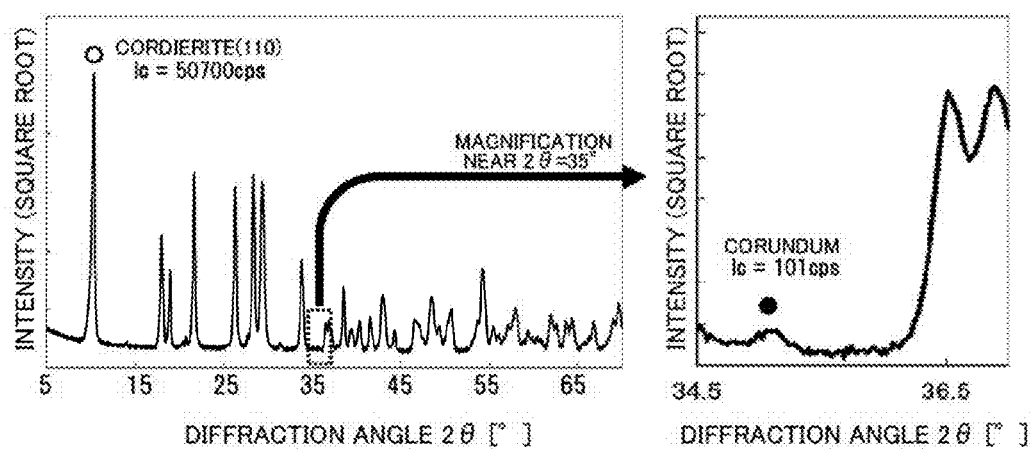
FIG. 4 is an XRD diffraction diagram of a pulverized product of a cordierite sintered body of Experimental Example 1.
Figure 5:
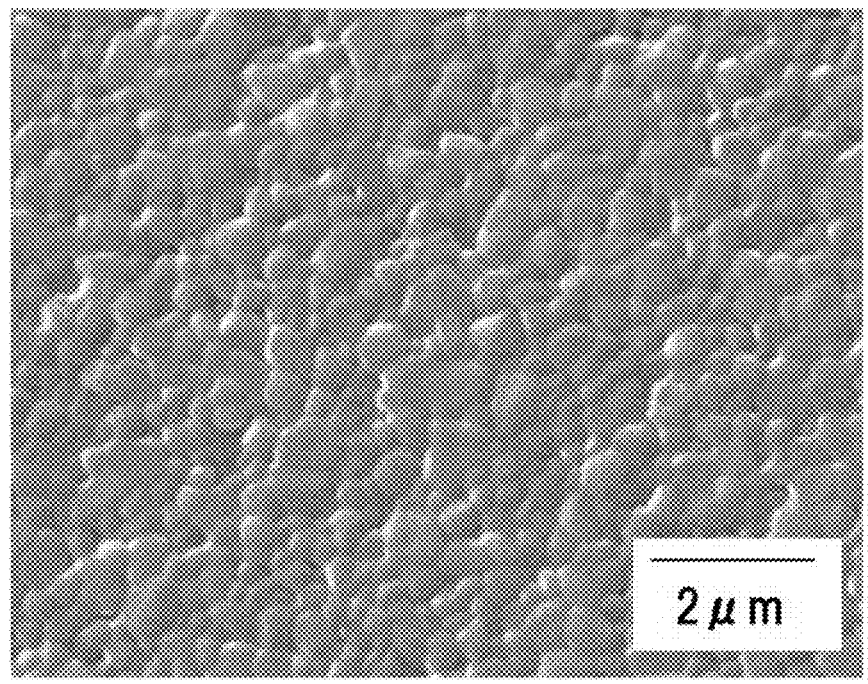
FIG. 5 is a SEM image of a polished surface of the cordierite sintered body of Experimental Example 1.
Figure 6:
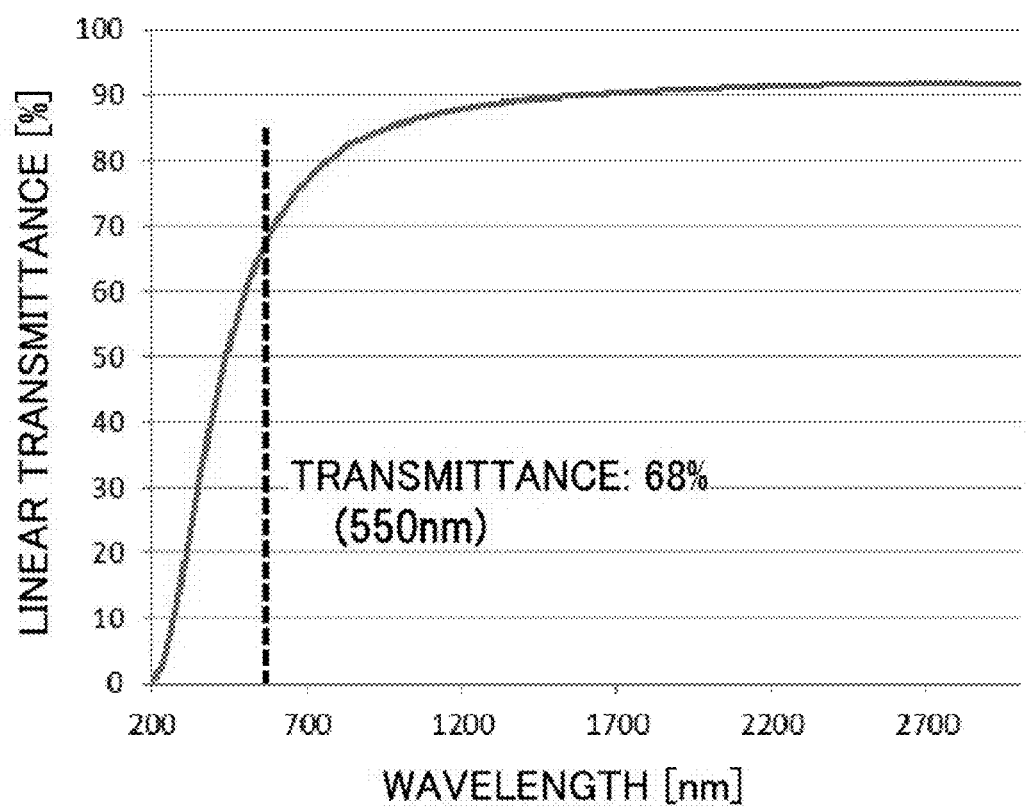
FIG. 6 is a transmittance curve of the cordierite sintered body of Experimental Example 1.
Figure 7:
FIG. 7 is an external photo of the cordierite sintered body of Experimental Example 1.

A cordierite sintered body of Experimental Example 1 was obtained by sintering the cordierite raw material powder A at a press pressure of 200 kgf/cm² and 1,425° C. for 5 hours. The molar ratios of $MgO/Al_2O_3$ and $SiO_2/Al_2O_3$ of the cordierite sintered body thus obtained were 1.00 and 2.50, respectively, and were not so much shifted from the stoichiometric ratio of cordierite, and the amount of impurities was also small. The bulk density of the sintered body was 2.507 g/cm³ and was remarkably closed to a cordierite true density of 2.505 g/cm³, and it was found that closed pores were hardly contained. FIG. 4 shows an XRD diffraction diagram of a pulverized product of the cordierite sintered body of Experimental Example 1. Although corundum (• in the graph) was only detected as a phase other than that of cordierite, the peak intensity ratio Ix to the peak top intensity of the (110) plane (o in the graph) of the cordierite was extremely small, such as 0.0020. FIG. 5 shows the result of SEM observation of a polished surface of the cordierite sintered body which was thermal-etched. Accordingly, it was found that the average grain diameter of the cordierite sintered grains was 0.6 μm and that significantly fine cordierite grains were densely sintered. In addition, in a range of 4 μm×4 μm of the polished surface, the number of pores having a maximum length of 0.1 μm or more was 3. As for the surface flatness of the polished surface, it was found that the center line average roughness Ra was low, such as 0.8 nm, and that the maximum peak height was also small, such as 20 nm. FIG. 6 shows a transmittance curve as the optical characteristics. It was found that the linear transmittance was significantly high, such as 60% or more, at a wavelength of 500 to 3,000 nm, and a material having a significantly high transparency was obtained. An exterior photo of the sample of the cordierite sintered body thus obtained is shown in FIG. 7. A mark with an NGK logo drawn in FIG. 7 is the registered trademark of NGK Insulators, Ltd.

Experimental Examples 2 and 3

Cordierite sintered bodies of Experimental Examples 2 and 3 were obtained by sintering the cordierite raw material powders B and C, respectively, under the conditions similar to those of Experimental Example 1. The compositions of the cordierite sintered bodies thus obtained and the molar ratios of the components thereof were as shown in Table 2, and the shift thereof from the stoichiometric ratio of cordierite was significantly small. As for the other characteristics, characteristics similar to those of Experimental Example 1 were obtained, and sintering could be densely performed with a small number of pores while the amount of the different phases was small; hence, it was found that a material having a high surface flatness could be obtained. The transparency was also high as was the case of Experimental Example 1.

Experimental Example 4

In Experimental Example 4, except that the firing temperature was set to 1,400° C., a cordierite sintered body was formed under conditions similar to those of Experimental Example 1. It was found that since the firing temperature was low, a cordierite-forming reaction of raw material components, such as alumina and silica, was not sufficiently advanced, and a large amount of different phases of corundum and cristobalite remained. As for the surface flatness of the polished surface, the center line average roughness Ra was high, such as 1.8 nm, and the maximum peak height Rp was large, such as 28 nm. From the results described above, it was estimated that the degree of polishability was different between cordierite and the different phase component and in particular, that since not easily polished, the different phase component was liable to remain in a convex form.

Experimental Example 5

In Experimental Example 5, except that the firing temperature was set to 1,400° C., a cordierite sintered body was formed under conditions similar to those of Experimental Example 2. As was the case of Experimental Example 4, since the firing temperature was low, corundum and cristobalite remained as different phases, and as for the surface flatness of the polished surface, an Ra of 1.3 nm and an Rp of 31 nm were both inferior.

Experimental Example 6

In Experimental Example 6, except that the cordierite raw material powder D was used, a cordierite sintered body was formed under conditions similar to those of Experimental Example 1. Since alumina in the raw material was excessive, alumina was also excessive in the sintered body. As a result, the molar ratio of $MgO/Al_2O_3$ was 0.94, and the molar ratio of $SiO_2/Al_2O_3$ was 2.36, so that the molar ratios were each smaller than that of the cordierite composition. The amounts of corundum and cristobalite detected as the different phases were large, and as for the surface flatness of the polished surface, since Ra and Rp were large, such 3.5 nm and 88 nm, respectively, the flatness could not be improved by finishing.

Experimental Example 7

In Experimental Example 7, except that the cordierite raw material powder E was used, a cordierite sintered body was formed under conditions similar to those of Experimental Example 1. The molar ratio of $MgO/Al_2O_3$ of the cordierite sintered body was 0.93 which indicated that MgO was deficient; corundum and cristobalite were detected as different phases; and from the peak intensity ratio Ix, it was found that the amounts thereof were also large. Accordingly, as for the surface flatness of the polished surface, Ra and Rp were large, such as 3.3 nm and 67 nm, respectively, and the flatness could not be improved by finishing.

Experimental Example 8

In Experimental Example 8, except that the cordierite raw material powder F was used, a cordierite sintered body was formed under conditions similar to those of Experimental Example 1. The molar ratio of $SiO/Al_2O_3$ of the cordierite sintered body was 2.42 which indicated that $SiO_2$ was deficient; corundum was detected as a different phase; and from the peak intensity ratio Ix, it was found that the amount thereof was also large. Accordingly, as for the surface flatness of the polished surface, Ra and Rp were large, such as 2.1 nm and 40 nm, respectively, and the flatness could not be improved by finishing.

Experimental Example 9

In Experimental Example 9, except that the cordierite raw material powder G was used, a cordierite sintered body was formed under conditions similar to those of Experimental Example 1. The molar ratio of $MgO/Al_2O_3$ of the cordierite sintered body was 1.09 which indicated that MgO was excessively present; enstatite was detected as a different phase by XRD; and in addition, small amounts of corundum and cristobalite were recognized. The peak intensity ratio Ix by XRD was high, and the amount of the different phases was large. Accordingly, as for the surface flatness of the polished surface, Ra and Rp were large, such as 1.5 nm and 29 nm, respectively, and the flatness could not be improved by finishing.

Experimental Example 10

Figure 8:
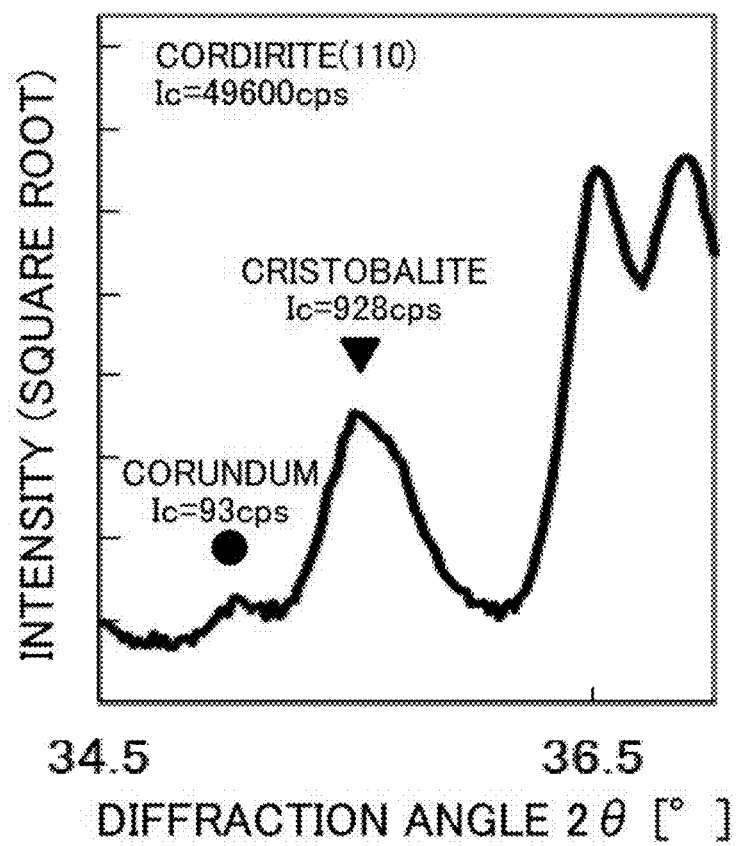
FIG. 8 is an XRD diffraction diagram of a pulverized product of a cordierite sintered body of Experimental Example 10.

In Experimental Example 10, except that the cordierite raw material powder H was used, a cordierite sintered body was formed under conditions similar to those of Experimental Example 1. The molar ratio of $SiO_2/Al_2O_3$ of the cordierite sintered body was 2.65 which indicated that $SiO_2$ was excessively present. FIG. 8 shows an XRD diffraction diagram of a pulverized product of the cordierite sintered body of Experimental Example 10. From FIG. 8, cristobalite and a small amount of corundum were detected by XRD as different phases, and from the peak intensity ratio Ix, it was found that the amount of the different phases was large. Accordingly, as for the surface flatness of the polished surface, Ra and Rp were large, such as 3.1 nm and 47 nm, respectively, and the flatness could not be improved by finishing.

Experimental Example 11

In Experimental Example 11, except that the cordierite raw material powder I was used, and that the firing temperature was set to 1,400° C., a cordierite sintered body was formed under conditions similar to those of Experimental Example 1. A large amount of $Fe_2O_3$ and $TiO_2$ components, each of which was an impurity derived from a natural raw material, was contained. From XRD, iron oxide, corundum, and sapphirine were detected as different phases, the peak intensity ratio Ix was high, and the amount of the different phases was large. Accordingly, as for the surface flatness of the polished surface, Ra and Rp were 3.5 nm and 84 nm, respectively, and the flatness could not be improved by finishing.

Experimental Examples 12 to 14

In Experimental Examples 12, 13, and 14, except that the press pressures were set to 20, 50, and 100 $kgf/cm^2$, respectively, cordierite bodies were each formed under conditions similar to those of Experimental Example 1. The composition of the cordierite sintered body thus obtained and the molar ratios of the components thereof were as shown in Table 2, and the shift from the stoichiometric ratio of cordierite was significantly small in all the cordierite sintered bodies. In addition, the other characteristics obtained as shown in Table 3 were similar to those of Experimental Example 1, and sintering could be densely performed with a small number of pores while the amount of the different phases was small; hence, it was found that a material having a high surface flatness could be formed. The transparency was also high as was the case of Experimental Example 1. Since the cordierite sintered body could be formed at a low press pressure, the size of a hot press jig could be reduced, and the life thereof could be increased.

Experimental Examples 15 to 17

In Experimental Examples 15, 16, and 17, the cordierite sintered bodies formed in Experimental Example 1 were processed by an annealing treatment at 1,200° C., 1,300° C., and 1,400° C., respectively, for 2 hours, and the optical characteristics thereof were evaluated. Total light transmittances of 80%, 83%, and 84% and linear transmittances of 70%, 70%, and 71% were obtained, respectively, and by performinq an annealing treatment at a high temperature, improvement in translucency and transparency could be observed.

3. Formation and Evaluation of Composite Substrate

A composite substrate was formed using the cordierite sintered body as the support substrate. Concrete formation examples will be shown in Experimental Examples 18 to 23. In addition, Experimental Examples 18 to 21 correspond to the examples of the present invention, and Experimental Examples 22 and 23 correspond to the comparative examples of the present invention.

Experimental Examples 18 to 21

In Experimental Examples 18 to 21, by the use of the cordierite sintered body of Experimental Examples 1 as the support substrate, a composite substrate was formed. As the support substrate, a substrate was used which had a diameter of 100 mm and a thickness of 230 μm or 500 μm and had a surface finished by a diamond lap polishing and a CMP polishing to have an Ra of 0.4 to 0.9 nm and an RP of 6 to 20 nm. The support substrate processed by a CMP polishing was processed by a cleaning treatment using an amine solution, an SPM (sulfuric acid/hydrogen peroxide mixture), and an RCA cleaning solution, each of which has been generally used, to remove organic substances, particles, and the like on a substrate surface and was then used for joining. On the other hand, for the functional substrate, a single crystal substrate, such as lithium tantalate (LT), lithium niobate (LN), gallium nitride (GaN), or silicon (Si), was use and was formed to have the shape and the surface finish similar to those of the support substrate.

In Experimental Example 18, an LT substrate having a thickness of 250 μm was tried to be joined to the support substrate having a thickness of 230 μm. For an activation treatment on the surface before joining, argon beams were irradiated on the two substrates using an ion gun. Subsequently, after being adhered to each other, the two substrates were pressed at a joining load of 10 ton for 1 minute, so that the support substrate and the LT substrate were directly joined to each other at room temperature. In the composite substrate thus obtained, air bubbles were hardly observed at the joining interface, and the rate (joining area rate) of the area at which the two substrates were actually joined to each other to the joining interface was 95% or more, so that preferable joining was obtained. In addition, the joining area is an area in which when the joining interface is viewed from a transparent support substrate side, no air bubbles are present, and the joining area rate is the rate of the joining area to the area of the entire joining interface.

In Experimental Example 19, an LN substrate was used Instead of the LT substrate, and as was the case of Experimental Example 18, direct joining with the support substrate having a thickness of 500 μm was tried. The joining area rate was 90% or more, and preferable joining was also obtained as was the case of Experimental Example 18.

In Experimental Example 20, a silicon substrate was used instead of the LT substrate, and as was the case of Experimental Example 18, direct joining with the support substrate having a thickness of 230 μm was tried. The joining area rate was approximately 100%, and significantly preferable joining was obtained.

In Experimental Example 21, a cranium nitride substrate was used instead of the LT substrate, and as was the case of Experimental Example 18, direct joining with the support substrate having a thickness of 230 μm was tried. The joining area rate was 80% or more, and preferable joining was obtained.

Experimental Examples 22 and 23

In Experimental Example 22, by the use of the cordierite sintered body of Experimental Example 5 as the support substrate, a composite substrate was formed. A support substrate having a thickness of 230 μm and a surface finished to have an Ra of 1.4 nm and an Rp of 35 nm was used. Although direct joining of the LT substrate to this support substrate was tried as was the case of Experimental Example 18, the joining area rate was less than 60%, a space was observed at the interface, and sufficient joining could not be obtained.

In Experimental Example 23, by the use of the cordierite sintered body of Experimental Example 11 as the support substrate, a composite substrate was formed. In this support substrate, the amounts of impurity phases and different phases of corundum and sapphirine were large, the surface processed by a CMP polishing had an Ra of 3.6 nm and an Rp of 90 nm, and those characteristics were both inferior to those of the materials of Experimental Examples 18 to 21 described above. Although direct joining of the LT substrate to this support substrate (thickness: 230 μm) was tried as was the case of Experimental Example 18, the joining area rate was 20% or less, and sufficient joining could not be obtained.

In Table 4, the materials, the joining area rates, and the evaluation results of joining properties of Experimental Examples 18 to 23 are collectively shown.

TABLE 4

| | Support Substrate (Cordierite Sintered Body) | Functional Substrate | Joining Area Rate | Evaluation Result of Joining Properly |
|---|---|---|---|---|
| Experimental Example 18 | Experimental Example 1 | LT | 96% | Good |
| Experimental Example 19 | Experimental Example 1 | LN | 93% | Good |
| Experimental Example 20 | Experimental Example 1 | Si | 99% | Good |
| Experimental Example 21 | Experimental Example 1 | GaN | 84% | Good |
| Experimental Example 22 | Experimental Example 5 | LT | 58% | Not Good |
| Experimental Example 23 | Experimental Example 11 | LT | 17% | Not Good |

In addition, it is to be naturally understood that the present invention is not limited at all to the examples described above.

The present application claims priority from Japanese Patent Application No. 2014-117926 filed on Jun. 6, 2014, and Japanese Patent Application No. 2015-059873 filed on Mar. 23, 2015, the entire contents of which are incorporated herein by reference.

What is claimed is:

1. A cordierite sintered body wherein in an X-ray diffraction diagram, the ratio of the total of maximum peak intensities of components other than cordierite components to the peak top intensity of the (110) plane of cordierite is 0.0025 or less, an average grain diameter of cordierite sintered grains is 1 μm or less, and a molar ratio of $MgO/Al_2O_3$ is 0.96 to 1.04 and a molar ratio of $SiO_2/Al_2O_3$ is 2.46 to 2.54, wherein a total light transmittance through the cordierite sintered body, with respect to light having a wavelength of 550 nm, is 60% or more.

2. The cordierite sintered body according to claim 1, wherein the total light transmittance through the cordierite sintered body, with respect to light having a wavelength of 550 nm, is 75% or more.

3. The cordierite sintered body according to claim 1, wherein the sintered body contains at least 99.9 percent by mass of MgO, $Al_2O_3$ and $SiO_2$.

4. The cordierite sintered body according to claim 1, wherein a linear transmittance through the cordierite sintered body, with respect to light having a wavelength of 550 nm, is 50% or more.

5. The cordierite sintered body according to claim 1, having a mirror surface.

6. The cordierite sintered body according to claim 5, wherein a center line average roughness Ra of the surface in a 10-μm square measurement region is 1 nm or less.

7. The cordierite sintered body according to claim 5, wherein a maximum peak height Rp of the surface in a 70-μm square measurement region is 30 nm or less.

8. A composite substrate formed by joining a functional substrate and a support substrate formed of a cordierite sintered body, wherein a rate of an area at which the substrates are actually joined to each other to a joining interface is 80% or more, and the cordierite sintered body is the sintered body according to claim 5.

9. The composite substrate according to claim 8, wherein the joining is direct joining.

10. An electronic device using the composite substrate to claim 8.

11. An electronic device using the composite substrate according to claim 9.

12. A method for manufacturing the cordierite sintered body according to claim 1, comprising sintering a cordierite raw material powder containing an MgO component, an $Al_2O_3$ component, and a $SiO_2$ component in an inert gas atmosphere using a hot press method, wherein in the cordierite raw material powder, the molar ratio of $MgO/Al_2O_3$ is 0.96 to 1.04, the molar ratio of $SiO_2/Al_2O_3$ is 2.46 to 2.54, MgO, $SiO_2$ and $Al_2O_3$ are present in an amount of at least 99.9 percent by mass, and an average grain diameter D50 of the cordierite raw material powder is 1 μm or less, and as conditions for sintering using the hot press method, a press pressure is 20 to 300 kgf/cm², and a firing temperature is 1,410° C. to 1,450° C.

* * * * *